US008668502B2

(12) United States Patent
Chang et al.

(10) Patent No.: US 8,668,502 B2
(45) Date of Patent: Mar. 11, 2014

(54) ELECTRICAL ASSEMBLY AND SOCEKG CONNECTOR THEREIN

(75) Inventors: Yen-Chih Chang, New Taipei (TW); Chih-Pi Cheng, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 201 days.

(21) Appl. No.: 13/231,977

(22) Filed: Sep. 14, 2011

(65) Prior Publication Data

US 2012/0064742 A1 Mar. 15, 2012

(30) Foreign Application Priority Data

Sep. 14, 2010 (TW) ............................ 099217731 A

(51) Int. Cl.
*H01R 12/00* (2006.01)
*H05K 1/00* (2006.01)

(52) U.S. Cl.
USPC ........................................................ 439/71

(58) Field of Classification Search
USPC ............................... 439/68, 70–72, 329–331
See application file for complete search history.

(56) References Cited

U.S. PATENT DOCUMENTS

| | | | | |
|---|---|---|---|---|
| 4,460,237 | A * | 7/1984 | Brown et al. | 439/71 |
| 6,270,357 | B1 * | 8/2001 | Pfaff | 439/71 |
| 6,390,827 | B1 * | 5/2002 | Howell et al. | 439/70 |
| 7,147,510 | B2 * | 12/2006 | Asai et al. | 439/607.27 |
| 7,374,431 | B2 * | 5/2008 | Su | 439/73 |
| 7,594,818 | B1 * | 9/2009 | Asai | 439/71 |
| 2011/0111616 | A1 * | 5/2011 | Chang et al. | 439/329 |

FOREIGN PATENT DOCUMENTS

TW M380610 5/2010

* cited by examiner

*Primary Examiner* — Felix O Figueroa
(74) *Attorney, Agent, or Firm* — Wei Te Chung; Ming Chieh Chang

(57) ABSTRACT

An electrical assembly used for connecting an IC package, includes at least an upper and a lower layer stacked with each other, wherein the upper layer is formed with an opening for receiving a socket connector. The socket connector has contacts electrically connected to conductive traces respectively provided on the upper and the lower layer.

17 Claims, 5 Drawing Sheets

ELECTRICAL ASSEMBLY AND SOCEKG CONNECTOR THEREIN

BACKGROUND OF THE INVENTION

1. Field of the Invention

The present invention relates to an electrical assembly and a socket connector for the assembly, and particularly to an electrical assembly with a socket connector sinking therein so as to have a low profile.

2. Description of Related Art

Taiwan Utility Pat. No. M380610 and the corresponding US patent application publication number 20110111616 having the same inventors and the assignee with the instant invention, discloses an electrical assembly for connection with an integrated circuit (IC) package. The assembly includes a main board and a socket connector assembly mounted within the main board. The socket connector assembly further includes a socket connector with a number of contacts received therein and an adapter plate attached to and electrically connected with the socket connector. The main board is formed by a printed circuit board (PCB) and includes a first layer, a second and a third layer which are stacked with one another. The second and third layers are respectively formed with openings which are corresponding to each other and jointly define a cavity for accommodation of the socket connector assembly. The contacts extend to the bottom surface of the socket connector and are electrically connected to the conductive pads in the PCB via the adaptor plated. Because of the sinking configuration of the socket connector, the total height of the assembly is decreased, thereby saving space in a system, such as a case of a computer.

However, the contacts are all extended to the bottom surface of socket connector and are arranged in a high density array, which is therefore not ready for the layout design of conductive traces integrated in the main board which receives and connects to the socket connector. On the other hand, as the socket assembled is sunken into the main board, the first and second layers of the copper membrane therein is therefore wasted.

In view of the above, an improved electrical assembly and a socket connector for the assembly are desired to overcome the problems mentioned above.

SUMMARY OF THE INVENTION

Accordingly, an object of the present invention is to provide an electrical assembly which makes most utilization of first and second copper layers of a main board and to provide a socket connector having solder tails specially suitable for interconnection with first and second copper layers of the main board.

According to one aspect of the present invention, there is provided an electrical assembly which includes a main board and a socket connector. The main board includes at least an upper layer and a lower layer dielectrically stacked with each other and each is etched to provided with first conductive traces for signal transmission. The main board is formed with an opening with a plurality of first conductive pads interconnected to the conductive traces and distributed along an edge of the opening. The lower layer is etched also with a plurality of second conductive traces and with a plurality of second conductive pads disposed at its end thereof on an upper surface thereof and exposed by the opening of the upper layer. The socket connector is received and seated in the opening and includes a socket body and a plurality of first and second contacts mounted within the socket body. The first contacts extend to a bottom surface of the socket body and are connected with the second conductive pads of the lower layer of the main board, and the second contacts are arranged along sidewalls of the socket body and are electrically connected to both part of the first contacts and the first conductive pads of the upper layer of the main board.

According to another aspect of the present invention there is provided a socket connector for receiving an IC package. The socket connector includes a socket body defining a mating portion for the IC package and sidewalls enclosing the mating portion, and a plurality of first contacts and second contacts. The first contacts are arranged within the mating portion for connection with the IC package. The first contact has a lower end extending to a bottom surface of the socket body. The second contacts are arranged along the sidewalls and extend outwardly.

Other objects, advantages and novel features of the invention will become more apparent from the following detailed description when taken in conjunction with the accompanying drawings, in which:

DETAILED DESCRIPTION OF THE INVENTION

Reference will now be made to the drawings to describe the present invention in detail.

Figure 1:
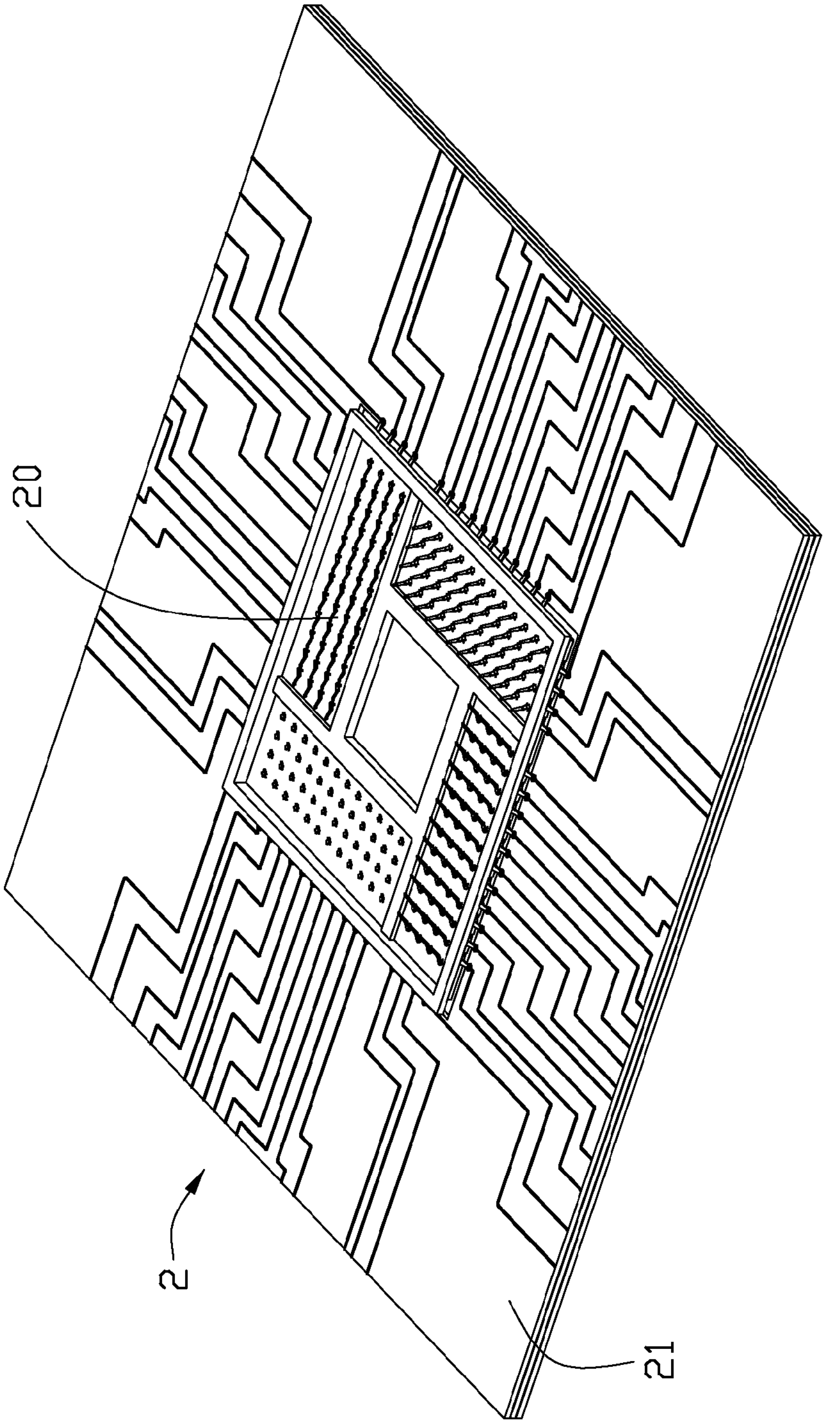
FIG. 1 is an assembled, perspective view of an electrical assembly in accordance with a preferred embodiment of the present invention.
Figure 2:
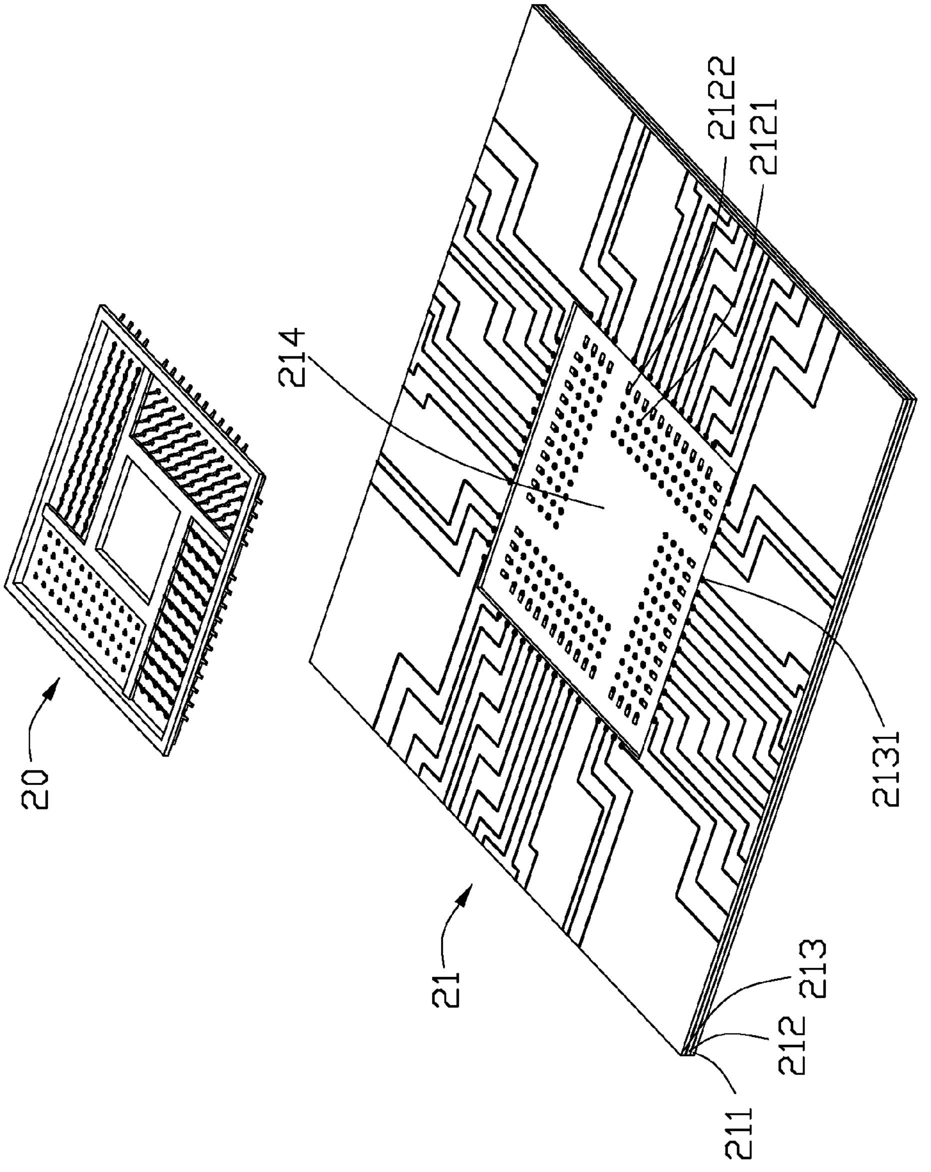
FIG. 2 is an exploded, perspective view of the electrical assembly as shown in FIG. 1.

Referring to FIG. 1 and FIG. 2, the electrical assembly 2 made in accordance with the present invention includes a main board 21 and a socket connector 20 mounted within the main board 21 for receiving an IC package (not shown). The main board 21 is formed by a PCB and is constituted by a first layer 211, a second layer 212, and a third layer 213 which are stacked with one another and respectively provided with conductive traces for signal transmission. The third layer 213 is formed with an opening 214 therein for receiving the socket connector 20. A plurality of first conductive pads 2131 are formed on an upper surface of the third layer 213 along edges of the opening 214, and a region of the second layer 212 that is exposed by the opening 214 is formed thereon with a plurality of second contractive pads 2121.

Figure 3:
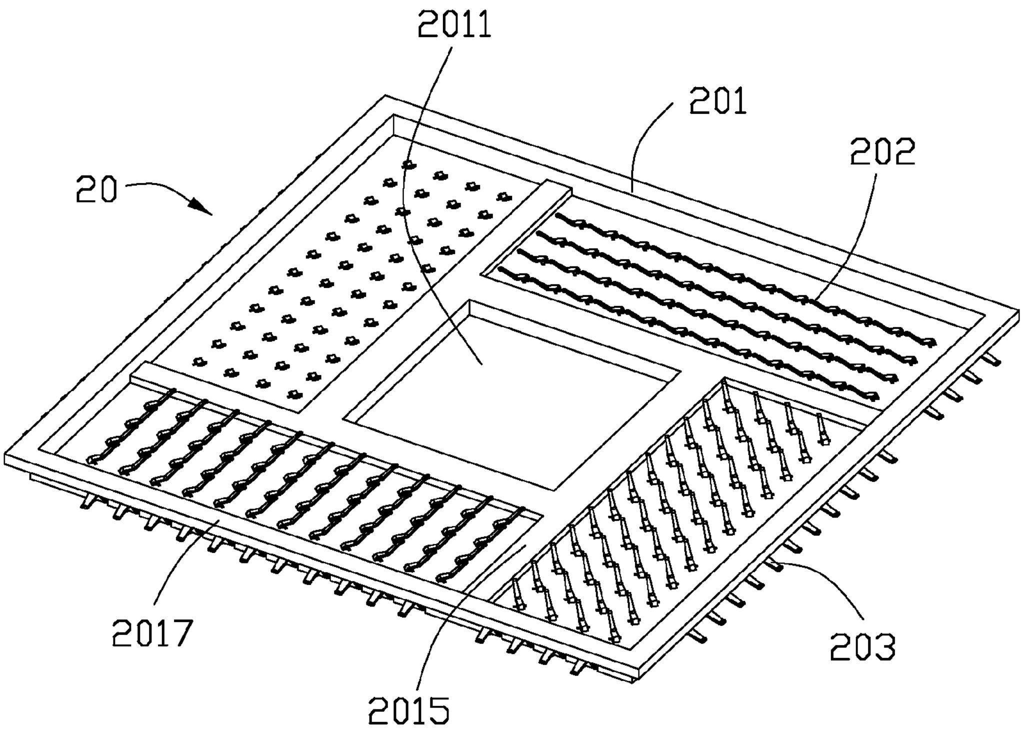
FIG. 3 is an assembled, perspective view of a socket connector in accordance with the preferred embodiment of the present invention.
Figure 4:
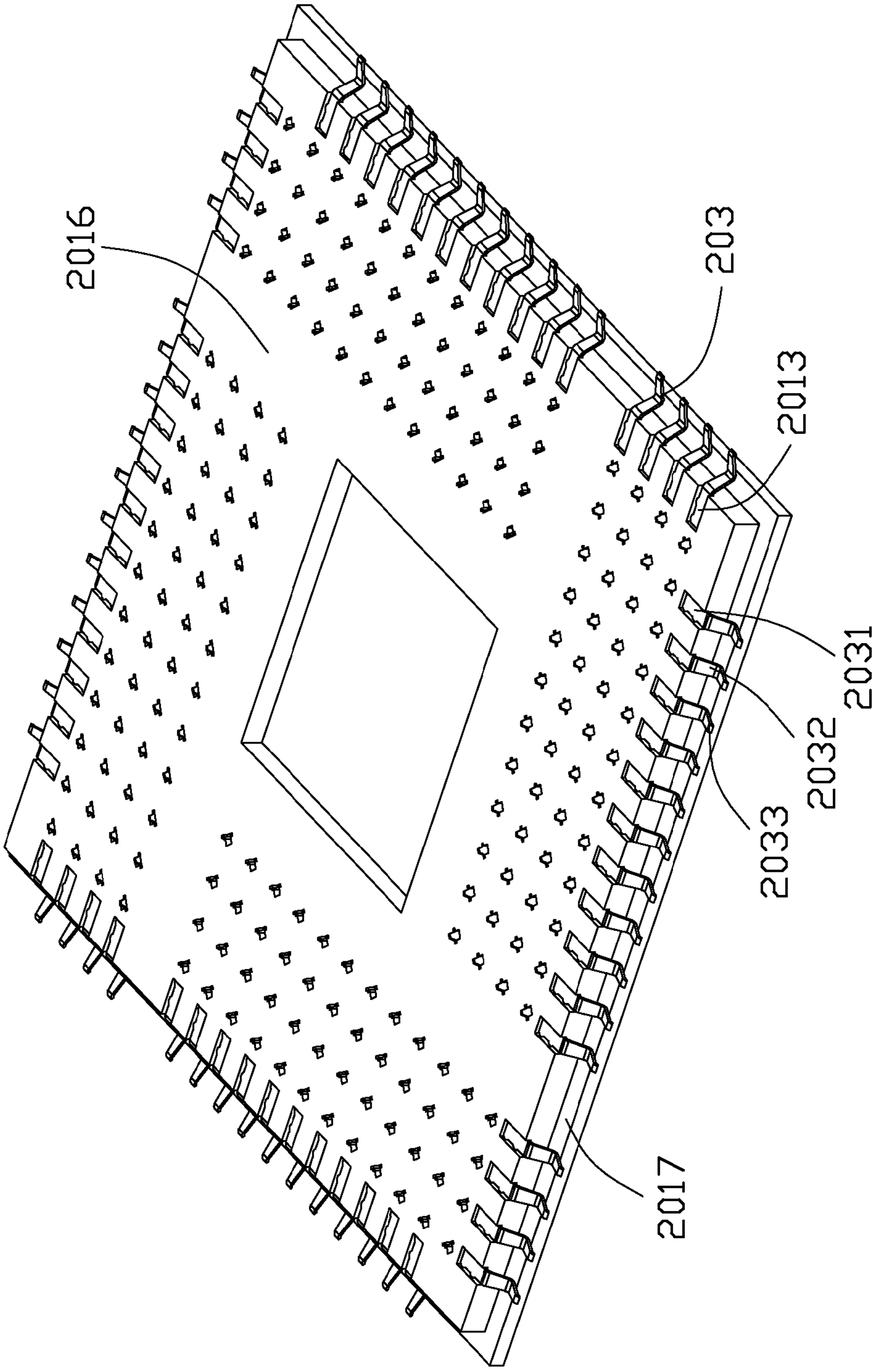
FIG. 4 is another perspective view of the socket connector as shown in FIG. 3.
Figure 5:
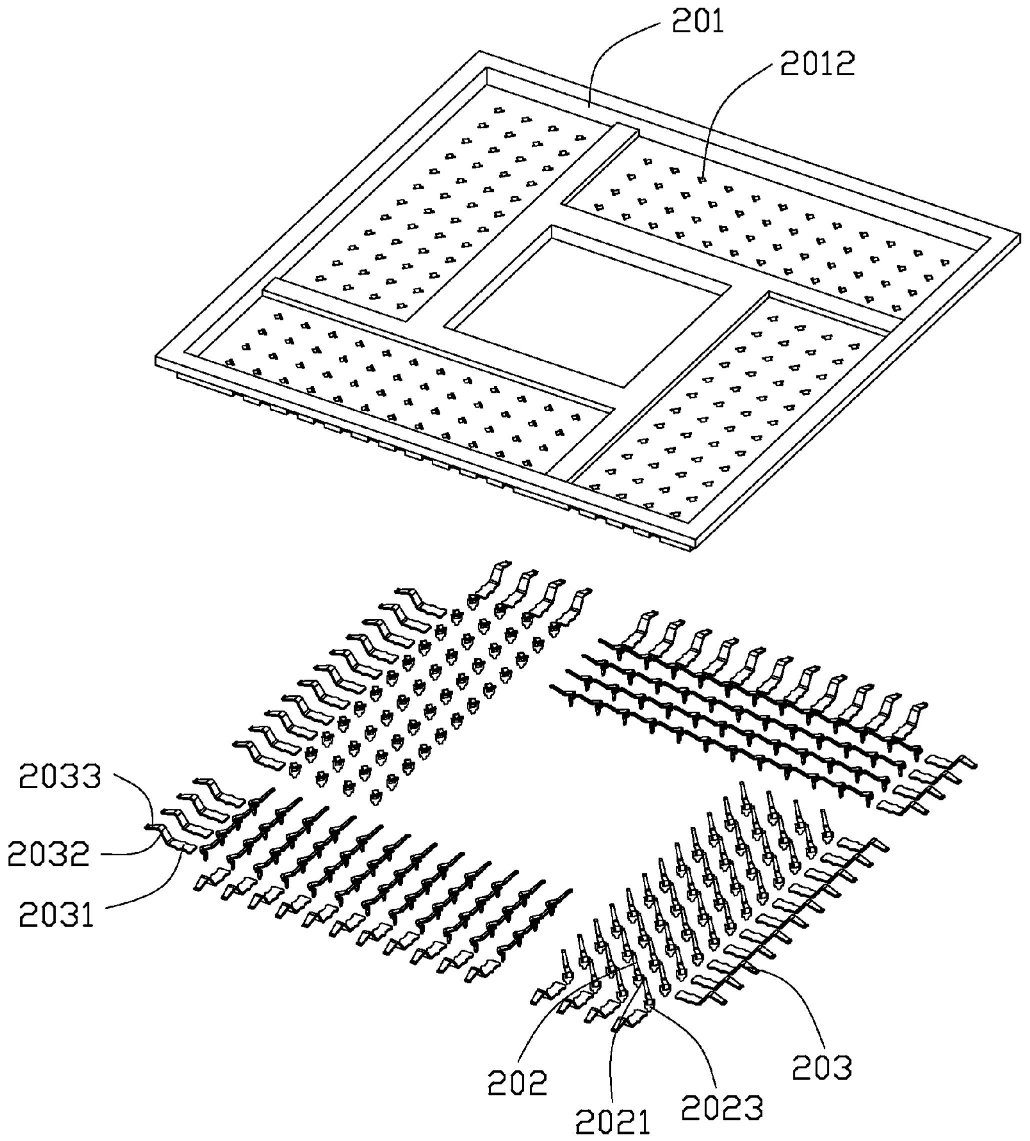
FIG. 5 is an exploded, perspective view of the socket connector as shown in FIG. 3 and FIG. 4.

Referring to FIGS. 3-5, the socket connector 20 includes a socket body 201 defining a mating portion 2015 for the IC package and sidewalls 2017 enclosing the mating portion 2015. A plurality of first contacts 202 are arranged within the mating portion 2015 and respectively received in passageways 2012 defined by the mating portion 2015. The first contacts 202 are divided into four groups which are partitioned from one anther. The first contact 202 has an upper end 2021 extending beyond an upper surface of the mating portion 2015 for connection with the IC package and a lower end 2023 extending to a bottom surface 2016 of the socket body 201 for connection with the second layer 212. The upper ends 2021 of the contacts 202 in different groups have different extending directions. A plurality of second contacts 203 are arranged along the sidewalls 2017 and extend outwardly. The second contact 203 includes a first contacting portion 2031 located at the bottom of the socket body 201, a second contacting portion 2033 extending outwardly, and an extending portion 2032 interconnecting between the first and second contacting portions 2031, 2033. The socket connector 20 further includes a central aperture 2011 between the four groups of the first contacts 202.

The socket connector 20 is both electrically connected to the second and the third layer 212, 213 when mounted into the main board 21. The lower ends 2023 of the first contacts 202 are engaged with the second conductive pads 2121 including the outermost ones 2122 on the upper surface of the second layer 212. The second contacts 203 have their first contacting portions 2031 contact with the outermost second conductive pads 2122 and second contacting portions 2033 contact with the first conductive pads 2131 on the third layer 213. Therefore, the outermost first contacts 202 and the second contacts 203 are electrically connected with each other via the outermost second conductive pads 2122. The conductive traces corresponding to the outermost first contacts 202 are transferred from the second layer 212 to the third layer 213, thereby decreasing the density of the traces on the second layer 212 and increasing the space utilization of the third layer 213.

According to the preferred embodiment of the present invention, both the first contacts 202 and the second contacts 203 are respectively soldered to the second conductive pads 2121, 2122. The first contacting portion 2031 of the second contact 203 has a horizontal structure ready for being soldered with the outermost second conductive pad 2122, and the second contacting portion 2033 has an elastic structure so as to reliably engage the first conductive pad 2131 by its own elasticity.

While preferred embodiments in accordance with the present invention has been shown and described, equivalent modifications and changes known to persons skilled in the art according to the spirit of the present invention are considered within the scope of the present invention as defined in the appended claims.

What is claimed is:

1. An electrical assembly, comprising a main board includes at least an upper copper layer and a lower copper layer dielectrically stacked with each other and each etched to form with first and second conductive traces for signal transmission, the main board defining an opening with a plurality of first conductive pads interconnected to the first conductive traces and distributed along an edge of the opening, a plurality of second conductive pads disposed at ends of the second conductive traces located on an upper surface thereof; and a socket connector electrically and physically seated in the opening and including a socket body and a plurality of first and second contacts mounted therein, the first contacts having first tail portions extending to a bottom surface of the socket body and interconnected with the second conductive pads of the lower layer on the main board; and wherein the second contact comprises a horizontally structure fixed to the bottom surface of the socket body and a cantilever structure extending out of edges of the socket body to solder upon corresponding first conductive pad.

2. The electrical assembly as claimed in claim 1, wherein first conductive pads are formed on an upper surface of the upper layer of the main board.

3. The electrical assembly as claimed in claim 1, wherein the second contact and an outermost first contact are both connected to a same outermost second conductive pad such that the second contact and the outermost first contact are electrically connected.

4. The electrical assembly as claimed in claim 3, wherein the second contact comprise a first contacting portion located at the bottom of the socket body and engaged with the outermost second conductive pad and a second contacting portion extending outwardly and engaged with the first conductive pad.

5. The electrical assembly as claimed in claim 4, wherein the horizontal structure is included in the first contacting portion ready for being soldered with the outermost second conductive pad, and the cantilever structure includes said second contacting portion having an elastic structure so as to reliably engage the first conductive pad by its own elasticity.

6. The electrical assembly as claimed in claim 1, wherein the first contacts are divided into at least two groups which are partitioned from each other.

7. The electrical assembly as claimed in claim 6, wherein said at least two groups of the first contacts have upper ends extending along different directions.

8. The electrical assembly as claimed in claim 6, wherein the socket connector further comprises a central aperture between said at least two groups of the first contacts.

9. A socket connector for receiving an IC package, comprising:

a socket body defining a mating portion for the IC package and sidewalls enclosing the mating portion;

a plurality of first contacts arranged within the mating portions for connection with the IC package, each first contact having a lower end extending to a bottom surface of the socket body;

a plurality of second contacts arranged along the sidewalls and extending outwardly;

wherein said at least one first contact is connected to a first external element, while the second contact is connected to both the first external element and a second external element;

wherein the second contact comprise a first contacting portion located at the bottom of the socket body and engaged with the first external element and a second contacting portion extending outwardly and engaged with the second external element;

wherein the first contacting portion has a horizontal structure ready for being soldered with the first external element, and the second contacting portion has an elastic structure so as to reliably engage the second external element by its own elasticity.

10. The socket connector as claimed in claim 9, wherein at least one first contact is electrically connected with the second contact.

11. The electrical assembly as claimed in claim 9, wherein the first contacts are divided into at least two groups which are partitioned from each other.

12. The electrical assembly as claimed in claim 11, wherein said at least two groups of the first contacts have upper ends extending along different directions.

13. The electrical assembly as claimed in claim 9, further comprising a central aperture between said at least two groups of the first contacts.

14. An electrical connector assembly comprising:

a printed circuit board defining two opposite upper and bottoms surfaces;

a recess formed in the printed circuit board under the upper surface while not through the bottom surface and defining an upward mounting surface lower than the upper surface thereon;

a plurality of first conductive pads disposed upon the upward mounting surface;

a plurality of second conductive pads disposed upon the upper surface around a periphery of the recess;

an electrical connector including:

an insulative housing having a main portion which is compliantly fitted into the recess and defines opposite upper and bottom faces thereof;

a plurality of first contacts disposed in the main portion, each of the first contacts defining an upper end extending upwardly above the upper face, and a lower end extending around the mounting surface to electrically and mechanically connect to the corresponding first conductive pads, respectively;

a plurality of second contacts disposed around the periphery of the housing, each of said second contacts defining a tab soldered upon the corresponding second conductive pads, respectively.

15. The electrical connector assembly as claimed in claim 14, wherein said tab is resilient.

16. The electrical connector assembly as claimed in claim 14, wherein the periphery of the housing is located transversely outside of and above the recess.

17. The electrical connector assembly as claimed in claim 14, wherein there are traces extending from the corresponding second conductive pads and terminated at a periphery of the printed circuit board.

* * * * *